(12) United States Patent
Mikalo et al.

(10) Patent No.: US 9,368,506 B2
(45) Date of Patent: Jun. 14, 2016

(54) INTEGRATED CIRCUITS AND METHODS FOR OPERATING INTEGRATED CIRCUITS WITH NON-VOLATILE MEMORY

(71) Applicant: GLOBALFOUNDRIES, Inc., Grand Cayman (KY)

(72) Inventors: Ricardo Pablo Mikalo, Heideblick (DE); Stefan Flachowsky, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/741,528

(22) Filed: Jun. 17, 2015

(65) Prior Publication Data

US 2015/0333080 A1    Nov. 19, 2015

Related U.S. Application Data

(62) Division of application No. 13/834,019, filed on Mar. 15, 2013, now Pat. No. 9,087,587.

(51) Int. Cl.
*G11C 11/34* (2006.01)
*H01L 27/115* (2006.01)
(Continued)

(52) U.S. Cl.
CPC ........ *H01L 27/11521* (2013.01); *G11C 16/045* (2013.01); *G11C 16/0433* (2013.01);
(Continued)

(58) Field of Classification Search
CPC ................ H01L 27/11521; H01L 29/0649; H01L 29/4916; G11C 16/045
USPC ............................ 365/185.05, 185.14, 185.26
See application file for complete search history.

(56) References Cited

U.S. PATENT DOCUMENTS 5,301,150 A    4/1994  Sullivan et al.
6,100,560 A *  8/2000  Lovett ................... H01L 27/115
                                                          257/315
(Continued)

FOREIGN PATENT DOCUMENTS

CN          101110268 A       1/2008

OTHER PUBLICATIONS

The Intellectual Property Office, Examination Report for Taiwanese Patent Application No. 102135800 dated Jul. 20, 2015.
(Continued)

*Primary Examiner* — Viet Q Nguyen
(74) *Attorney, Agent, or Firm* — Ingrassia Fisher & Lorenz, P.C.

(57) ABSTRACT

Integrated circuits and methods for fabricating integrated circuits are provided. In an exemplary embodiment, an integrated circuit includes a semiconductor substrate doped with a first conductivity-determining impurity. The semiconductor substrate has formed therein a first well doped with a second conductivity-determining impurity that is different from the first conductivity-determining impurity, a second well, formed within the first well, and doped with the first conductivity-determining impurity, and a third well spaced apart from the first and second wells and doped with the first conductivity-determining impurity. The integrated circuit further includes a floating gate structure formed over the semiconductor substrate. The floating gate structure includes a first gate element disposed over the second well and being separated from the second well with a dielectric layer, a second gate element disposed over the third well and being separated from the third well with the dielectric layer, and a conductive connector.

19 Claims, 3 Drawing Sheets

(51) Int. Cl.
  *G11C 16/04* (2006.01)
  *H01L 29/06* (2006.01)
  *H01L 29/49* (2006.01)
  *H01L 29/423* (2006.01)

(52) U.S. Cl.
  CPC ...... *H01L27/11558* (2013.01); *H01L 29/0649* (2013.01); *H01L 29/42324* (2013.01); *H01L 29/4916* (2013.01)

(56) References Cited

U.S. PATENT DOCUMENTS

| | | | |
|---|---|---|---|
| 6,731,541 B2 | 5/2004 | Kinsey et al. | |
| 6,788,574 B1 * | 9/2004 | Han | G11C 16/0408 257/E21.694 |
| 6,950,342 B2 | 9/2005 | Lindhorst et al. | |
| 6,992,938 B1 * | 1/2006 | Shubat | G11C 16/0441 365/131 |
| 7,099,192 B2 * | 8/2006 | Wang | G11C 16/0416 257/316 |
| 7,149,118 B2 | 12/2006 | Diorio et al. | |
| 7,326,994 B2 * | 2/2008 | Hsu | H01L 27/115 257/298 |
| 7,489,005 B2 | 2/2009 | Tanaka | |
| 7,626,864 B2 | 12/2009 | Wang | |
| 7,671,401 B2 | 3/2010 | Fang et al. | |
| 7,679,119 B2 | 3/2010 | Roizin et al. | |
| 7,700,994 B2 | 4/2010 | Roizin et al. | |
| 7,754,564 B2 | 7/2010 | Fenigstein et al. | |
| 7,759,727 B2 * | 7/2010 | Kalnitsky | G11C 27/005 257/321 |
| 7,894,261 B1 * | 2/2011 | Pesavento | G11C 16/0441 365/185.05 |
| 7,903,465 B2 * | 3/2011 | Haggag | G11C 16/0433 365/185.05 |
| 7,919,368 B2 | 4/2011 | Wu et al. | |
| 7,919,805 B1 | 4/2011 | Mirgorodski et al. | |
| 7,968,926 B2 * | 6/2011 | Huang | G11C 16/0441 257/300 |
| 7,983,081 B2 * | 7/2011 | Fang | G11C 16/02 257/316 |
| 8,000,139 B2 | 8/2011 | Kalnitsky et al. | |
| 8,107,290 B2 * | 1/2012 | Lee | G11C 16/0416 365/185.1 |
| 8,299,519 B2 * | 10/2012 | Chou | H01L 21/84 257/315 |
| 8,320,180 B2 * | 11/2012 | Kalnitsky | G11C 16/0433 365/185.16 |
| 8,378,407 B2 * | 2/2013 | Audzeyeu | G11C 16/0441 257/315 |
| 8,541,879 B2 * | 9/2013 | Smayling | H01L 21/76801 257/774 |
| 8,581,324 B2 * | 11/2013 | Wu | G11C 11/34 257/298 |
| 8,592,812 B2 * | 11/2013 | Tokashiki | H01L 22/14 257/290 |
| 8,592,886 B2 | 11/2013 | Hsu et al. | |
| 8,975,679 B1 * | 3/2015 | Chen | H01L 27/11558 257/298 |
| 9,041,089 B2 * | 5/2015 | Chen | H01L 27/11524 257/315 |
| 9,087,587 B2 * | 7/2015 | Mikalo | G11C 16/045 |
| 2007/0120176 A1 | 5/2007 | Tanaka | |
| 2008/0137408 A1 | 6/2008 | Roizin et al. | |
| 2010/0039868 A1 * | 2/2010 | Mitchell | G11C 16/0416 365/185.28 |
| 2010/0157669 A1 | 6/2010 | Audzeyeu et al. | |
| 2011/0101348 A1 | 5/2011 | Tokashiki | |
| 2012/0074479 A1 | 3/2012 | Wu et al. | |

OTHER PUBLICATIONS

State Intellectual Property Office of the People's Republic of China, First Office Action for Chinese Patent Application No. 201410098111.0 mailed Apr. 5, 2016.

* cited by examiner

INTEGRATED CIRCUITS AND METHODS FOR OPERATING INTEGRATED CIRCUITS WITH NON-VOLATILE MEMORY

CROSS-REFERENCE TO RELATED APPLICATION

This application is a division of U.S. patent application Ser. No. 13/834,019, filed on Mar. 15, 2013, the contents of which are herein incorporated by reference in their entirety.

TECHNICAL FIELD

The present disclosure generally relates to integrated circuit and methods for operating integrated circuits. More particularly, the present disclosure relates to integrated circuits and methods for operating integrated circuits having non-volatile memory devices, such as flash memory devices.

BACKGROUND

Non-volatile solid-state read/write memory devices are now commonplace in many electronic systems, particularly in portable electronic devices and systems. A common technology for realizing non-volatile solid-state memory devices, more specifically for realizing electrically erasable programmable memory devices, utilizes "floating-gate" transistors to store the data state. According to this conventional technology, the memory cell transistor is "programmed" by biasing it so that electrons tunnel through a thin dielectric film onto an electrically isolated transistor gate element. The trapped electrons on the floating gate will raise the apparent threshold voltage of the memory cell transistor (for n-channel devices), as compared with the threshold voltage with no electrons trapped on the floating gate. This difference is made apparent by different source-drain conduction under normal transistor bias conditions. Modern non-volatile memory devices are "erasable" in that the memory cell transistors can be biased to remove the electrons from the floating gate, again by way of a tunneling mechanism. "Flash" memory devices are typically realized by such non-volatile memory arrays, in which the erase operation is applied simultaneously to a large number (a "block") of memory cells.

According to one approach, non-volatile memory cells are realized by metal-oxide semiconductor (MOS) transistors having two polysilicon gate electrodes. A control gate electrode is electrically connected to provide an electrical connection with other circuitry in the integrated circuit, and a floating gate is disposed between the control gate electrode and the channel region of the memory transistor. In this conventional construction, electrons tunnel to the floating gate upon application of a high programming voltage to the control gate (which capacitively couples to the floating gate) relative to the source and drain regions of the memory transistor.

Because of the convenience and efficiency of modern flash memories, it is now desirable and commonplace to embed flash memory within larger scale integrated circuits, such as modern complex microprocessors, digital signal processors, and other large-scale logical circuitry. Such embedded memory can be used as non-volatile program memory storing software routines executable by the processor, and also as non-volatile data storage. On a smaller scale, flash memory cells can be used to realize control registers from which a larger scale logical circuit can be configured, and also to "trim" analog levels after electrical measurement.

State of the art processes used to integrate flash memory into larger scale integrated circuits typically employ an additional gate oxide layer and a dual-level polysilicon architecture to obtain non-volatile memory cells. This dual-level polysilicon architecture adds significant complexity to the design of the integrated circuit, in addition to the process steps required to fabricate the dual-level architecture. For many applications, such as small-batch integrated circuit manufacturing operations, it is not time or cost effective to employ a dual-level architecture.

Accordingly, it is desirable to provide integrated circuits and methods for fabricating integrated circuits with improved non-volatile memory devices. In addition, it is desirable to provide integrated circuits and methods for fabricating integrated circuits that do not require a dual-level polysilicon architecture. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for operating integrated circuits are provided. In an exemplary embodiment, an integrated circuit includes a semiconductor substrate doped with a first conductivity-determining impurity. The semiconductor substrate has formed therein a first well doped with a second conductivity-determining impurity that is different from the first conductivity-determining impurity, a second well, formed within the first well, and doped with the first conductivity-determining impurity, and a third well spaced apart from the first and second wells and doped with the first conductivity-determining impurity. The integrated circuit further includes a floating gate structure formed over the semiconductor substrate. The floating gate structure includes a first gate element disposed over the second well and being separated from the second well with a dielectric layer, a second gate element disposed over the third well and being separated from the third well with the dielectric layer, and a conductive connector that electrically connects the first and second gate elements. Still further, the integrated circuit includes source and drain regions disposed in the second well and doped with the second conductivity-determining impurity, the source and drains regions having conductive contacts formed thereto, a first terminal formed of electrical contacts to the first and second wells, and a second terminal formed of electrical contacts to the third well.

In another embodiment, an integrated circuit includes a silicon-on-insulator semiconductor substrate that includes a semiconductive layer and a bottom insulative layer disposed below the semiconductive layer. The semiconductive layer has formed therein a first well doped with a first conductivity determining impurity, source and drain regions disposed adjacent to the first well and doped with a second conductivity-determining impurity that is different from the first conductivity-determining impurity, a second well spaced apart from the first well by an insulating trench and doped with the first conductivity-determining impurity, and a plurality of highly-doped regions formed within the second well. The integrated circuit further includes a floating gate structure formed over the semiconductor substrate. The floating gate structure includes a first gate element disposed over the first well and being separated from the first well with a dielectric layer, a second gate element disposed over the second well and being separated from the second well with the dielectric layer, and a conductive connector that electrically connects the first and second gate elements. Still further, the integrated circuit includes a first terminal formed of an electrical contact to the first well and a second terminal formed of electrical contacts to the second well.

In yet another exemplary embodiment, a method of operating an integrated circuit includes the step of selecting one of a write procedure, an erase procedure, and a read procedure. If the write procedure is selected, the method further includes the step of applying a voltage from about 15 volts to about 30 volts to the second terminal. If the erase procedure is selected, the method further includes the step of applying a voltage from about 15 volts to about 30 volts to the first terminal. If the read procedure is selected, the method further includes the steps of applying a voltage from about 1 volt to about 5 volts to the drain and determining whether a current is conducted between the source and the drain.

BRIEF DESCRIPTION OF THE DRAWINGS

Embodiments of the present disclosure will hereinafter be described in conjunction with the following drawing figures, wherein like numerals denote like elements, and wherein.

DETAILED DESCRIPTION

The following Detailed Description is merely exemplary in nature and is not intended to limit the integrated circuits or methods for fabricating integrated circuits as claimed herein. Furthermore, there is no intention to be bound by any expressed or implied theory presented in the preceding Technical Field, Background, Brief Summary, or the following Detailed Description.

Figure 1:
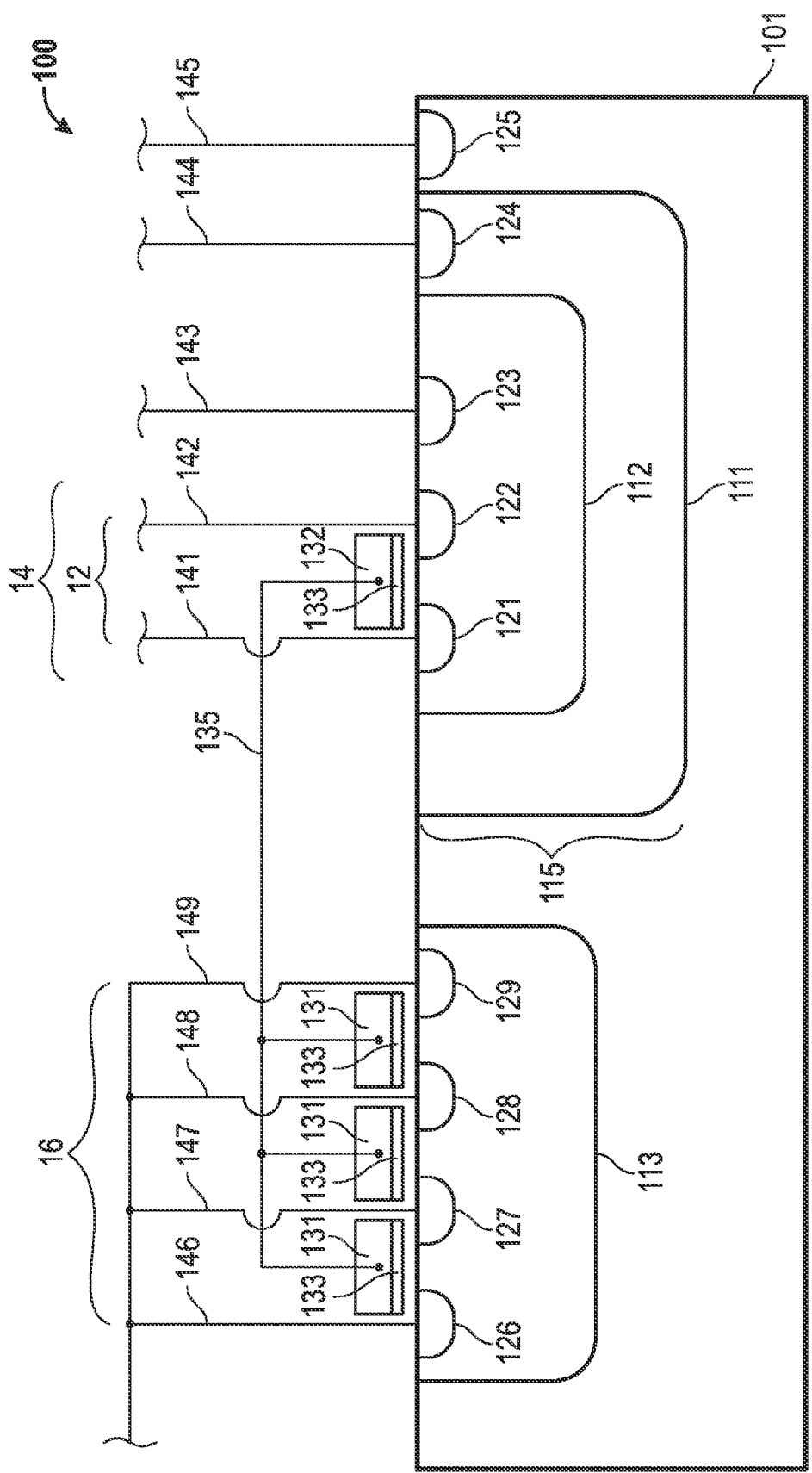
FIG. 1 is a cross-sectional view with an electrical diagram superimposed thereon of a non-volatile memory cell in accordance with one embodiment of the present disclosure.
Figure 2:
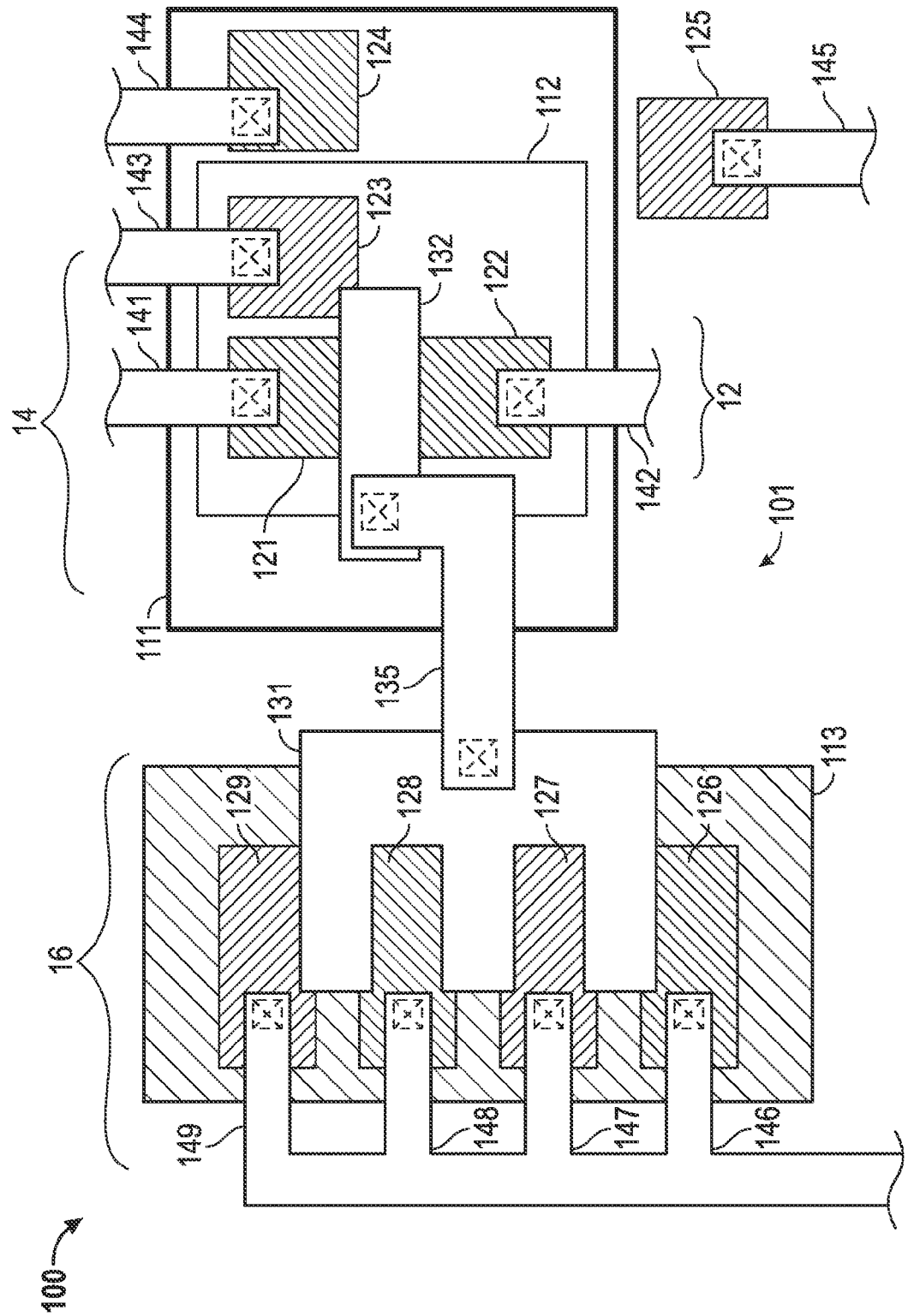
FIG. 2 is a plan view of the non-volatile memory cell of FIG. 1.

With reference now to FIGS. 1 and 2, depicted therein is an exemplary non-volatile memory cell 100 in accordance with one embodiment of the present disclosure. In this example, memory cell 100 includes the following function units: a floating-gate transistor 12, a tunneling capacitor 14, and a control capacitor 16. Floating-gate transistor 12 is typically an re-channel MOS transistor with source terminal 141 and drain terminal 142. The "floating" gate element 132 of transistor 12 is an electrically isolated (by dielectric layer 133, which can be a silicon oxide layer) conductive structure that is formed of, for example, polycrystalline silicon. In this example, transistor 12 is constructed so that it is a depletion mode device (i.e., threshold voltage <0) if no electrons are trapped on floating gate element 132. On the other hand, trapped electrons on floating gate element 132 will raise the threshold voltage of transistor 2 above zero volts, in which case floating gate element 132 holds transistor 12 off. The presence or absence of source-drain conduction in response to a positive drain-to-source voltage thus depends on whether electrons are trapped on floating gate element 132. If transistor 12 is "programmed" (i.e., electrons trapped on floating gate 132), source-drain conduction is zero for a positive drain-to-source voltage. Conversely, if transistor 12 is "erased" (no trapped electrons at floating gate element 132), transistor 12 will conduct in response to a positive drain-to-source voltage.

Floating gate element 132 of transistor 12 also serves as one capacitative plate of tunneling capacitor 14. The other capacitative plate of tunneling capacitor 14 is the region of well 112 underlying floating gate element 132. The dielectric layer 133 acts as the capacitor insulating layer of tunneling capacitor 14. Tunneling capacitor 14 is connected between terminal 143-144 (which is a combination of contacts 143 and 144, described in greater detail below) and floating gate element 132.

Floating gate element 132 of transistor 12 is connected via a conductive connection 135 to gate element 131. Thus, from an electrical perspective, the overall floating gate of transistor 12 can be though of as a combination of gate elements 131/132, which are electrically connected together by connection 135. That is, any electrons that tunnel to the first plate (floating gate element 132) of tunneling capacitor 14 will also necessarily be in electrical connection with gate element 131.

Control capacitor 16 formed from gate element 131 as the first plate and the region of well 113 underneath gate element 131 as the second plate. The dielectric layer 133 acts as the capacitor insulating layer of control capacitor 16. Control capacitor 16 is connected between terminal 146-149 (which is a combination of contacts 146, 147, 148, and 149, described in greater detail below) and the gate element 131.

Programming and erase operations are enabled by constructing control capacitor 16 to have a much larger capacitance than tunneling capacitor 14, for example at least about 1.5 times the capacitance of tunneling capacitor 14, such as at least about 3 times the capacitance of tunneling capacitor 14. As a result, if a differential voltage is applied at terminal 146-149 relative to terminal 143-144, the voltage induced onto floating gate structure 131/132 will be much closer to the voltage at terminal 146-149 than to the voltage at terminal 143-144. This differential voltage will thus primarily appear across tunneling capacitor 14, in which case any electrons that tunnel to and from floating gate structure 131/132 as a result of this differential voltage will do so through tunneling capacitor 14.

Tunneling capacitor 14 is constructed as a polysilicon-to-bulk silicon capacitor. At the tunneling capacitor 14, the bulk silicon substrate material 101, which includes a small amount of a conductivity-determining dopant of a first type (for example p-type), includes implanted therein a "triple-well" structure 115. The triple-well structure 115 includes an isolation well 111 formed with a conductivity determining dopant of a second type (for example n-type), an intermediate or "bulk" well 112, disposed within the isolation well 111, and formed from the first conductivity determining dopant (e.g., p-type), and a plurality of high-concentration doped regions 121-125, disposed within each of the bulk well 112, the isolation well 111, and the bulk silicon substrate material 101, each of which are formed from either the first or second conductivity-determining dopant (e.g., p-type or n-type). At least two of the plurality of high-concentration doped regions in the bulk well 112 are formed from the second conductivity determining dopant so as to provide source and drain regions 121, 122, respectively, of the transistor 12. At least one of the plurality of high-concentration doped regions in the bulk well 112 is formed from the first conductivity determining dopant (e.g., region 123) to allow for an electrical connection therewith via contact 143. At least one of the plurality of high-concentration doped regions in the isolation well 111 is formed from the second conductivity determining dopant (e.g., region 124) to allow for an electrical connection therewith via contact 124. Further at least one of the plurality of high-concentration doped regions in the bulk silicon substrate material 101 is formed from the first conductivity determining dopant (e.g., region 125) to allow for an electrical connection therewith via contact 145.

The size of tunneling capacitor 14 is defined by the area underlying polysilicon element 132. As shown in the cross-section of FIG. 1, dielectric film 133 is disposed between polysilicon element 132 and the surface of bulk well 112, and serves as the capacitor dielectric. To enable tunneling of electrons therethrough, dielectric film 20 is a relative thin layer, typically formed of silicon dioxide or silicon nitride, for example on the order of about 40 Å to about 150 Å in thickness. High-concentration well region 123 within bulk well 112 provides a non-rectifying top-side electrical contact to bulk well 112, as both the well region 123 and the bulk well 112 are formed of the same conductivity determining dopant (e.g., p-type). High concentration regions 124 and 125 likewise provide the same functionality with regard to isolation well 111 and bulk silicon substrate 101. Conductive contacts 141 through 145, formed through overlying dielectric layers (not illustrated) provide electrical connection to the high-concentration doped regions 121 through 125, respectively. For example, terminal 143-144 is composed of the conductive contacts 143 and 144 by way of an overlying metal or other conductor level (not shown) through contact openings in common to regions 123 and 124, respectively. As such, bulk well 112 within isolation well 111 is at the same potential as the isolation well 111 itself, thus serving as the opposing plate of tunneling capacitor 14 from polysilicon floating gate element 132.

Control capacitor 16 is also a polysilicon-to-bulk silicon substrate capacitor, again with dielectric film 133 serving as the capacitor dielectric. A plurality of high-concentration doped regions 126 through 129, each of which may be of the first or second conductivity-determining types (e.g., p-type or n-type), are formed within a well 113, which is formed from the conductivity-determining dopant of the second type (e.g., n-type). With regard to the high-concentration doped regions 126 through 129, those formed of the first conductivity determining dopant (e.g., p-type) are provided to enhance capacitive control in control capacitor 16. Those formed of the second conductivity-determining dopant (e.g., n-type) provide a non-rectifying connection to the well 113, which is also formed from the conductivity-determining dopant of the second type (e.g., n-type). Terminal 146-149 is composed of the conductive contacts 146, 147, 148, and 149 by way of an overlying metal or other conductor level (not shown) in common to regions 126, 127, 128, and 129, respectively, to set the potential of one plate of control capacitor 16, i.e., the region underlying gate element 131. Polysilicon element 131, which is typically configured to have three or more "prongs" (as shown particularly in FIG. 2), serves as the other plate of control capacitor 16.

Transistor 12 is an n-channel MOS transistor realized by high-concentration doped regions of the second type (e.g., n-type) 121, 122 acting as source and drain regions at the surface of bulk well 112. In the conventional manner, source and drain regions 121 and 122 are formed by n+ source-drain diffusion after the formation of polysilicon element 132, so that transistor 12 is of the self-aligned type. Dielectric film 133 serves as the gate dielectric for transistor 12, at locations underlying polysilicon element 132. The drain terminal is connected to the drain 122 through contact 142 on one side of polysilicon element 132, and the source terminal is connected to the source 121 on another side of polysilicon element 132 through contact 141. In this example, a p-type diffusion region 123 is also defined within bulk well 112 to provide electrical contact with the "body node" (i.e., the bulk well 112) of transistor 12 via a corresponding contact 143. Typically, this body node contact via p-type diffusion region 123 is at the same potential as source terminal. While the example described herein is an n-channel MOS transistor, it will be appreciated that the processes and techniques described herein may also be employed to fabricate a p-channel MOS transistor. Further, an integrated circuit formed in accordance with the present disclosure may have a plurality of transistors, included both re-channel and p-channel transistors (thus being a CMOS integrated circuit). Still further, while the example described herein provides for an erasable/re-programmable memory device, it is also possible to fabricate one-time programming (OTP) devices. In the case of an OTP device, the tripe-well construction is not necessary (using instead as single body well, as is known in the art).

As shown particularly in FIG. 2, polysilicon elements 131 and 132 form a combined floating gate structure, via conductive connector 135, that serves as a plate of capacitors 14, 16 and as floating gate structure 131/132 of transistor 12 in memory cell 100. The area defined by polysilicon element 131 overlying well 113 is much larger than that defined by polysilicon element 132 overlying bulk well 112, because of the "pronged" shape of polysilicon element 131. As shown best in the example of FIG. 2, polysilicon element 131 has three "prongs" overlying well 113, but polysilicon element 132 only a single, shorter length prong overlying bulk well 112. This difference in underlying area establishes the difference in capacitance between tunneling capacitor 14 and control capacitor 16.

In operation, the state stored by non-volatile memory cell 101 is programmed and erased by differential voltages applied to terminals 146-149 and 144-145. The majority of any differential voltage across terminals 146-149 and 144-145 appears as a voltage drop across tunneling capacitor 14, because of the much larger capacitance of control capacitor 16 relative to tunneling capacitor 14. Therefore, to "program" transistor 12 by trapping electrons on floating gate structure 131/132, the voltages applied to the terminals of memory cell are:

| Source Terminal | Drain Terminal | Terminal 143-144 | Terminal 146-149 |
|---|---|---|---|
| 0V | 0V | 0V | Vw |

Vw is a relatively high voltage (e.g., about +10 to about +30 volts, for example about +25 volts), depending of course on the thickness of dielectric layer 133. Because the differential voltage Vw mostly couples to floating gate structure 131/132, a relatively high voltage (approaching voltage Vw) is established across tunneling capacitor 14. If this voltage is sufficiently high to enable electrons to tunnel through dielectric layer 133, and because polysilicon floating gate element 132 is at a positive voltage relative to wells 111 and 112, electrons will tunnel from these structures to polysilicon element 132. Upon removal of this programming bias condition, those electrons will remain trapped on the electrically isolated polysilicon floating gate element 132, and more broadly floating gate structure 131/132 due to the conductive connector 135 between polysilicon gate elements 131 and 132.

Conversely, memory cell 100 is erased by removing trapped electrons from floating gate 131/132. This is accomplished by the bias condition:

| Source Terminal | Drain Terminal | Terminal 143-144 | Terminal 146-149 |
|---|---|---|---|
| 0V | 0V | Ve | 0V |

Ve, like Vw, is some relatively large voltage (e.g., about +10 to about +30 volts, for example about +25 volts), depending of course on the thickness of dielectric layer 133, of positive polarity relative to ground (at terminal 146-149). Again, because of the differences in capacitance between tunneling capacitor 14 and control capacitor 16, polysilicon floating gate element 132 is at a potential that is relatively close to ground. Because the voltage at wells 111 and 112 is high relative to that of polysilicon element 132, the electrons that were trapped on polysilicon floating gate element 132 (and 131) can tunnel through dielectric layer 133 to wells 111 and 112. This "erased" state remains after removal of bias, because of the electrical isolation of floating gate structure 131/132.

The state of memory cell 100 is read by applying a bias condition to transistor 12:

| Source Terminal | Drain Terminal | Terminal 143-144 | Terminal 146-149 |
|---|---|---|---|
| 0V | Vr | 0V | 0V |

Drain voltage Vr establishes a sufficient drain-to-source voltage to enable drain-to-source conduction to distinguish the state of memory cell 100. The specific level of drain voltage Vr depends on the characteristics of transistor 12, on the desired level of drain-to-source current, and on the available voltages within the integrated circuit, and is typically provided between about 1 volt and about 5 volts, for example about 2 volts. In this configuration, if electrons are trapped on floating gate element 132 (i.e., memory cell 100 is programmed), these electrons will effectively raise the threshold voltage (i.e., reduce the gate potential of transistor 12 relative to the source voltage) so that no drain-to-source conduction occurs. Conversely, if electrons are not trapped on floating gate element 132 (memory cell 100 is erased), the absence of electrons will result in a lower threshold voltage (or a higher gate potential), specifically a threshold voltage that enables source-drain conduction through transistor 12 under these bias conditions. The presence and absence of source-drain conduction through transistor 12 thus indicates whether memory cell 100 is programmed or is erased.

Figure 3:
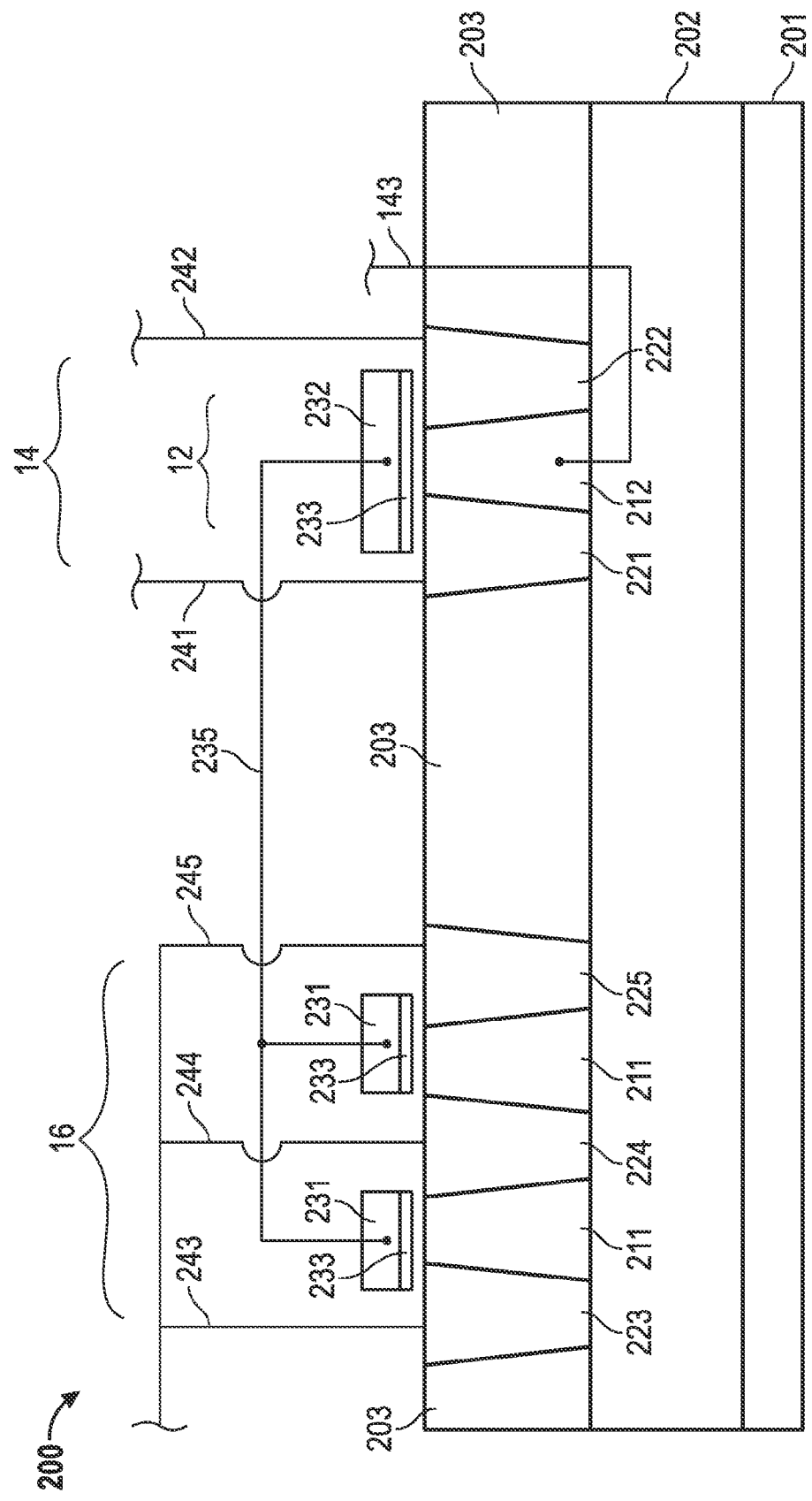
FIG. 3 is a cross-sectional view with an electrical diagram superimposed thereon of a non-volatile memory cell in accordance with another embodiment of the present disclosure.

FIG. 3 depicts another embodiment of the present disclosure, particularly non-volatile memory cell 200, that is disposed on a silicon-on-insulator (SOI) substrate as opposed to a bulk silicon substrate. Memory cell 200 includes a carrier silicon layer 201 over which is disposed a bottom insulating layer 202, which may be formed of, for example, silicon oxide. In this embodiment, the transistor 12 includes a well 212 formed from a first conductivity-determining dopant (e.g., p-type) and source and drain regions 221, 222 disposed on opposite sides of the well 212, and formed from a second conductivity-determining dopant (e.g., n-type). A polysilicon floating gate element 232, part of floating gate structure 231/232, overlies the well 212, with a thin insulating layer 233 disposed therebetween. Contacts 241 and 242 provide an electrical connection to the source 221 and drain 222, respectively, from an overlying conductive layer (not shown).

The tunneling capacitor 14 includes a first plate (the polysilicon floating gate element 232), a dielectric layer (the insulating layer 233), and a second plate (the doped polysilicon below the first plate, i.e., well 212. Voltage is applied to the tunneling capacitor 14 via contact 143 (which functions as a terminal), which is laterally connected with well 212, as shown in FIG. 3.

The control capacitor 16 includes a first plate is that is formed from polysilicon floating gate element 231, a dielectric layer that is formed from the insulating layer 233 below the polysilicon floating gate element 231, and a second plate that is formed from well 211. Well 211 is formed from silicon having the second conductivity-determining dopant implanted therein, and doped regions 223, 224, and 225 are each formed from silicon implanted with either the first or second type of conductivity-determining dopant. For example, region 224 may be of the first type (e.g., p-type), and regions 223 and 225 may be of the second type (e.g., n-type). Voltage is applied to the control capacitor via terminal 244-246, which is formed from the contacts 244, 245, and 246 to doped regions 223, 224, and 225, respectively. A "trench" insulating layer 203, formed of, for example, silicon oxide, electrically separates the doped regions of capacitors 14 and 16.

In this embodiment, the triple-well configuration is not needed because the bottom oxide layer 202 is formed directly below the wells 211, 212, and the doped regions 221 through 225, thus providing the electrical isolation that is provided by the triple-well configuration in the bulk silicon substrate example shown in FIGS. 1 and 2. Memory cell 200 functions in a manner that is analogous to memory cell 100, described above, regarding the writing, erasing, and reading functions.

As such, disclosed herein are various embodiments of a non-volatile memory device suitable for use in integrated circuits. The described memory devices do not require a dual-level polysilicon architecture, and as such can be incorporated into standard CMOS process flows without the need to add additional processing steps. The memory devices disclosed herein will thus save time and expense in the fabrication of integrated circuits with non-volatile memory devices, especially in low-volume applications where it is not cost-effective to implement a dual-level polysilicon architecture.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated circuit comprising:
 a semiconductor substrate comprising a semiconductive layer and a bottom insulative layer disposed below the semiconductive layer, the semiconductive layer having formed therein:
  a first well doped with a first conductivity determining impurity;
  source and drain regions disposed adjacent to the first well and doped with a second conductivity-determining impurity that is different from the first conductivity-determining impurity, wherein the source and drain regions extend entirely through the semiconductive layer so as to be in contact with the bottom insulative layer;

a second well spaced apart from the first well by an insulating trench and doped with the first conductivity-determining impurity; and a plurality of highly-doped regions formed within the second well that extend entirely through the semiconductive layer so as to be in contact with the bottom insulative layer;

a floating gate structure formed over the semiconductor substrate and comprising:

a first gate element disposed over the first well and being separated from the first well with a dielectric layer;

a second gate element disposed over the second well and being separated from the second well with the dielectric layer, wherein the second gate element comprises at least two prongs that extend substantially parallel to one another from a common base portion of the second gate element, each of the at least two prongs being disposed over a separate portion of the second well and between ones of the plurality of highly-doped regions; and a conductive connector that electrically connects the first and second gate elements;

a first terminal formed of an electrical contact to the first well; and a second terminal formed of electrical contacts to the second well.

2. The integrated circuit of claim 1, wherein the semiconductor substrate is a silicon-on-insulator substrate.

3. The integrated circuit of claim 1, wherein the semiconductor substrate further comprises a carrier silicon layer disposed below the insulative layer.

4. The integrated circuit of claim 3, wherein the insulative layer dielectrically separates the first and second wells from the carrier silicon layer.

5. The integrated circuit of claim 3, wherein the insulating trench is disposed over and in contact with the bottom insulative layer and separated a distance from the carrier silicon layer by the bottom insulative layer.

6. The integrated circuit of claim 1, wherein the first conductivity determining impurity is a p-type impurity.

7. The integrated circuit of claim 6, wherein the second conductivity determining impurity is an n-type impurity.

8. The integrated circuit of claim 1, wherein the first and second gate elements comprise polysilicon.

9. The integrated circuit of claim 1 comprising at least three highly-doped regions formed within the second well.

10. The integrated circuit of claim 1, wherein the bottom insulative layer comprises a silicon oxide.

11. The integrated circuit of claim 1, further comprising electrical contacts to each of the source and drain regions.

12. The integrated circuit of claim 11, further comprising an overlying conductive layer, apart from the conductive connector, in electrical connection with the electrical contacts to each of the source and drain regions.

13. The integrated circuit of claim 11, wherein the second terminal comprises electrical contacts to each of the plurality of highly-doped regions of the second well.

14. The integrated circuit of claim 13, wherein the electrical contacts to each of the plurality of highly-doped regions are separate and apart from the conductive connector.

15. The integrated circuit of claim 1, wherein the integrated circuit excludes a triple-well structure.

16. The integrated circuit of claim 1, wherein the first gate element forms a portion of a transistor.

17. The integrated circuit of claim 16, wherein the second gate element forms a portion of a control capacitor.

18. The integrated circuit of claim 16, wherein the transistor and the control capacitor form a portion of a memory cell.

19. The integrated circuit of claim 18, wherein the memory cell excludes a dual-level polysilicon architecture.

* * * * *